United States Patent [19]

Okajima

[11] Patent Number: 4,604,728

[45] Date of Patent: Aug. 5, 1986

[54] SEMICONDUCTOR MEMORY DEVICE

[75] Inventor: Yoshinori Okajima, Yokohama, Japan

[73] Assignee: Fujitsu Limited, Kawasaki, Japan

[21] Appl. No.: 510,349

[22] Filed: Jul. 1, 1983

[30] Foreign Application Priority Data

Jul. 2, 1982 [JP] Japan .............................. 57-116055
Dec. 29, 1982 [JP] Japan .............................. 57-233779

[51] Int. Cl.$^4$ .............................................. G11C 7/00
[52] U.S. Cl. .................... 365/189; 365/203; 365/180
[58] Field of Search ............... 365/155, 179, 189, 203, 365/233, 180, 181

[56] References Cited

U.S. PATENT DOCUMENTS

| 4,156,941 | 5/1979 | Homma et al. | 365/233 |
| 4,366,558 | 12/1982 | Homma et al. | 365/189 |
| 4,369,502 | 1/1983 | Isogai | 365/155 |
| 4,370,736 | 1/1983 | Takahashi | 365/155 |

Primary Examiner—Joseph A. Popek
Attorney, Agent, or Firm—Staas & Halsey

[57] ABSTRACT

A semiconductor memory device includes a plurality of static-type memory cells connected to pairs of word lines, each word line pair being composed of a word line having a high potential and a word line having a low potential, and a plurality of word-line discharging circuits, each being connected to one of the word line pairs. Each of the word-line discharging circuits includes, a thyristor whose anode is connected, via a voltage level shifter, to a word line having a high potential and whose cathode is connected to a constant-current source or a constant-voltage source. The thyristor comprises a PNP transistor and an NPN transistor. The NPN transistor can be a multi-emitter transistor or a multi-collector transistor whose second emitter or collector is connected to a word line having a low potential. If the NPN transistor is not a multi-emitter or multi-collector transistor, there is provided another NPN transistor whose base is connected to the base of the above-mentioned NPN transistor, whose collector is connected to the word line having a low potential, and whose emitter is connected to the second constant-current source or the second constant-voltage source.

15 Claims, 15 Drawing Figures

SEMICONDUCTOR MEMORY DEVICE

BACKGROUND OF THE INVENTION (1) Field of the Invention

The present invention relates to a semiconductor memory device and more particularly to the structure of a word-line discharging circuit using a PNPN element in a bipolar random access memory (RAM) device.

(2) Description of the Prior Art

Due to recent developments made in the technology of semiconductor memory devices, it has become necessary to increase the degree of integration of and to decrease the chip size of a high-speed bipolar semiconductor and MOS metal-oxide semiconductor (MOS) memory devices. The degree of integration of a MOS can be easily increased while that of a high-speed bipolar RAM device cannot. A high-speed bipolar RAM device is used especially as a working register in a central processing unit (CPU) of a large-scale electronic computer, etc. and is arranged in a high position in a memory hierarchy structure including low-speed, high-capacity memory devices and high-speed, low-capacity memory devices, i.e., in a position near an arithmetic circuit. A general-purpose, large-scale computer tends to use a parallel processing system or a multi-processing system, and the CPU thereof tends to be highly functional. In a CPU of future large-scale computers, it will be essential to integrate therein working registers at a high density. Therefore, it is necessary to increase the degree of integration of a bipolar RAM device while retaining the high-speed quality thereof. In a bipolar static RAM device, each of the static-type memory cells connected to word lines forms a type of capacitive load for a word line. Therefore, it is necessary to use word-line discharging circuits, each of which extracts a discharging current from a word line having a low potential so that electric charges are removed from the memory cells connected to a word line having a high potential when the word line having a high potential changes from a selected state to a non-selected state. It is also important that the degree of integration of the discharging circuits be large.

As is illustrated in FIG. 1, a conventional word-line discharging circuit uses a capacitor C having a large capacitance and resistors $R_1$ and $R_2$ having a large resistance. A discharging current flows for a predetermined period of time and is controlled by discharging the electric charges stored in the capacitor C through the resistors $R_1$ and $R_2$. In the discharging circuit 1 of FIG. 1, a word line $W^+$, having a high potential and being connected to a static-type memory cell 2 of a static RAM device, is connected to the base of an emitter-follower transistor $Q_1$, whose collector is connected to a high-voltage terminal of a voltage source $V_{CC}$. The emitter of the transistor $Q_1$ is connected to a constant-current source $I_1$ via the resistors $R_1$ and $R_2$. The common connecting point of a series connection of the resistors $R_1$ and $R_2$ is connected to a terminal of the capacitor C having a large capacitance. Another terminal of the capacitor is connected to a low-voltage terminal of the voltage source $V_{CC}$. The common connecting point of the resistors $R_1$ and $R_2$ is also connected to the base of a discharging transistor $Q_2$. The collector of the transistor $Q_2$ is connected to a word line $W^-$, having a low potential, and to the memory cell 2, and the emitter thereof is connected to a constant-current source $I_2$ for discharging a current.

In such a conventional discharging circuit using a capacitor C and resistors $R_1$ and $R_2$, when the word line $W^+$ having a high potential changes from a selected state to a non-selected state, i.e., when the potential $V_{W+}$ of the word line $W^+$ changes from high to low as illustrated in FIG. 2, the potential of the base of the discharging transistor $Q_2$ does not change from high to low immediately. That is, in such a transient state, since a constant current flows through the emitter of the emitter-follower transistor $Q_1$ into the constant current source $I_1$, the potential of the emitter thereof is always lower than the potential of the word line $W^+$ by a base-emitter forward-biased voltage of 0.8 V so that the potential of the emitter thereof falls immediately. However, the potential of the common connecting point of the resistors $R_1$ and $R_2$, i.e., the base of the discharging transistor $Q_2$, does not fall immediately because the capacitor C having a large capacitance is connected thereto. The potential of the base of the transistor $Q_2$ falls after the electric charges stored in the capacitor C are discharged through the resistors $R_1$ and $R_2$. Therefore, the collector current of the discharging transistor $Q_2$, i.e., the discharging current $I_{W-}$, continues to flow for a short time when the transistor $Q_2$ is in a turned-on state after the word line $W^+$, having a high potential, has changed from high to low, as illustrated in FIG. 2. The discharging current from the word line $W^-$ is cut off when the transistor $Q_2$ changes from a turned-on state to a turned-off state after a delay time T determined by the time constant of the discharging circuit. The conventional discharging circuit which operates in the above-mentioned manner uses a capacitor having a large capacitance and resistors having a large resistance. Therefore, if it is necessary to increase the time constant of the discharging circuit, the area occupied by the discharging circuit on a semiconductor chip becomes large, with the result that it is impossible to increase the degree of integration of a memory device using discharging circuits.

SUMMARY OF THE INVENTION

In order to eliminate the disadvantages of the above-mentioned conventional word-line discharging circuit, the present invention adopts the idea of making the delay time slow by using a thyristor formed as a PNPN element, i.e., a silicon-controlled rectifier (SCR), whose voltage response is relatively slow.

It is an object of the present invention to decrease the area occupied by the discharging circuits on a semiconductor chip and to provide a semiconductor memory device comprising word-line discharging circuits in which a discharging current from each of the word lines $W^+$ having a high potential and a discharging current from each of the corresponding word lines $W^-$ having a low potential are independently determined.

According to the present invention, there is provided a semiconductor memory device including: a plurality of static-type memory cells connected to pairs of word lines, each pair of word lines being composed of a word line having a high potential and a word line having a low potential, and a plurality of word-line discharging circuits, each discharging circuit being connected to one of the pairs of word lines. Each word-line discharging circuit includes a thyristor whose anode is connected, via a voltage level shifter, to one of the word lines of a pair of word lines having a high potential and whose cathode is connected to a constant-current source or a constant-voltage source.

DESCRIPTION OF THE PREFERRED EMBODIMENTS

Figure 3A:
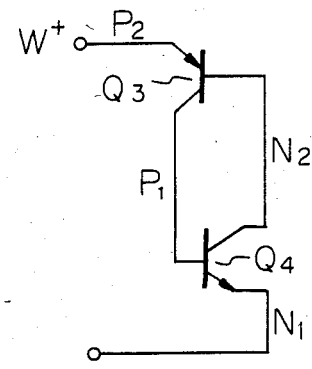
FIGS. 3A and 3B are circuit diagrams of the structure of SCRs used in a semiconductor memory device, according to the present invention.

The embodiments of the present invention are now explained with reference to the drawings. A word-line discharging circuit according to the present invention is characterized in that it uses an SCR which is a thyristor having a four-layer PNPN structure. The SCR has, as is illustrated in FIG. 3A, a four-layer structure $P_2N_2P_1N_1$ and is generally used as a P-gate SCR which has a gate electrode connected to the $P_1$ layer or as an N-gate SCR which has a gate electrode connected to the $N_2$ layer. The SCR having a four-layer PNPN structure is composed of two transistors $Q_3$ ($P_1N_2P_2$) and $Q_4$ ($N_1P_1N_2$) having different types of conductivity, the emitters of the transistors $Q_3$ and $Q_4$ being a $P_2$ layer and an $N_1$ layer, respectively. The collectors of the two transistors $Q_3$ and $Q_4$ are connected to the base of the transistors $Q_4$ and $Q_3$, respectively. Therefore, the two transistors $Q_3$ and $Q_4$ form a positive feedback circuit. If the anode $P_2$ of the SCR is positively biased and the cathode $N_1$ thereof is negatively biased, if one of the emitter junctions is caused to be forward-biased by using the base electrode of one of the corresponding transistors and if the collector current of the corresponding transistor is large enough to saturate another transistor, the collector junction of the other transistor is caused to be forward-biased and the SCR is switched to a turned-on state. The switching condition to turn on the SCR is $\alpha_1 + \alpha_2 \geq 1$, where $\alpha_1$ and $\alpha_2$ are current transmission factors of the transistors $Q_4$ and $Q_3$, respectively. Generally, since every PN junction has a capacitance, if a voltage v is applied between the anode electrode and the cathode electrode of an SCR, a charging current i flows from the anode to the cathode to electrically charge the capacitance c of the junction. That is, a current $i = c(dv/dt)$ flows from the anode to the cathode, and if the current i is large enough so that $\alpha_1 + \alpha_2$ is larger than or equal to 1, the SCR is turned on.

Figure 3B:
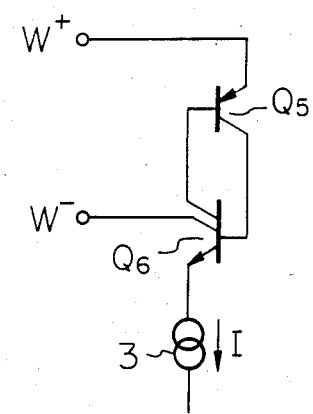

FIG. 3B is another type of PNPN element used in a semiconductor memory device according to the present invention. In FIG. 3B, $Q_5$ designates a PNP-type transistor whose emitter is connected to a word line $W^+$ having a high potential. The symbol $Q_6$ designates a multi-collector-type NPN transistor, one of the collectors of which is connected to a word line $W^-$ having a low potential. Reference numeral 3 designates a constant-current source through which a current I flows from the emitter of the transistor $Q_6$. The collector of the transistor $Q_5$ and the base of the transistor $Q_6$ (both electrodes are formed of P-type semiconductor regions) are commonly connected, and the base of the transistor $Q_5$ and the other collector of the transistor $Q_6$ (both electrodes are formed of N-type semiconductor regions) are commonly connected. Therefore, the circuit of FIG. 3B also has a PNPN-type element structure which is substantially the same as that of the thyristor of FIG. 3A.

Figure 4A:
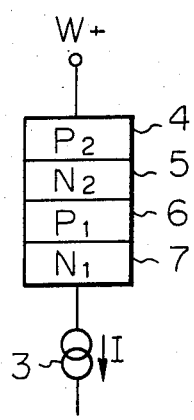
FIGS. 4A and 4B are circuit diagrams of equivalent circuits of the SCR of FIG. 3A and of FIG. 3B.
Figure 4B:
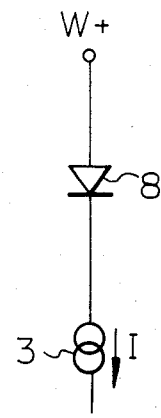

FIG. 4A is the element structure of the circuits of FIG. 3A and FIG. 3B. In FIG. 4A, 4 designates the emitter of the transistor $Q_3$ or $Q_5$, 5 designates the base of the transistor $Q_3$ or $Q_5$ connected to the collector of the transistor $Q_4$ or $Q_6$, 6 designates the collector of the transistor $Q_3$ or $Q_5$ and the base of the transistor $Q_4$ or $Q_6$, and 7 designates the emitter of the transistor $Q_4$ or $Q_6$. Generally, a thyristor is not turned on if it is not triggered. However, the direct current characteristic of the thyristor formed in an integrated circuit device is equivalent to the direct current characteristic of a diode 8 shown in FIG. 4B. This is because when a current is flowing through the thyristor, both the PNP-type transistors $Q_3$ or $Q_5$ and the NPN-type transistors $Q_4$ or $Q_6$ are saturated and three junctions of the thyristor are all in a forward-biased state. In order to obtain a current-voltage characteristic which is equivalent to that of the diode 8, it is necessary to control the parameters of the two transistors $Q_3$ or $Q_5$ and $Q_4$ or $Q_6$ so that the parameters assume appropriate values. Control of the parameters is quite easy.

Since the SCR is electrically equivalent to a capacitor having a large capacitance when it is switched from a turned-off state to a turned-on state, the present invention makes use of this important characteristic to delay the discharging current. That is, when the SCR is in a turned-on state, the transistors $Q_3$ and $Q_4$ or the transistors $Q_5$ and $Q_6$ are both saturated, and, therefore, each of the base-collector junctions of these transistors has a diffusion capacitance, in addition to a junction capacitance created by a depletion layer, which is large in proportion to the current flowing through the junctions. Since the PNPN structure has three junctions PN, NP, and PN and since each of these three junctions has a capacitance which is the sum of the above-mentioned junction capacitance and diffusion capacitance, the capacitance of the PNPN structure, i.e., the SCR, is large.

Figure 5:
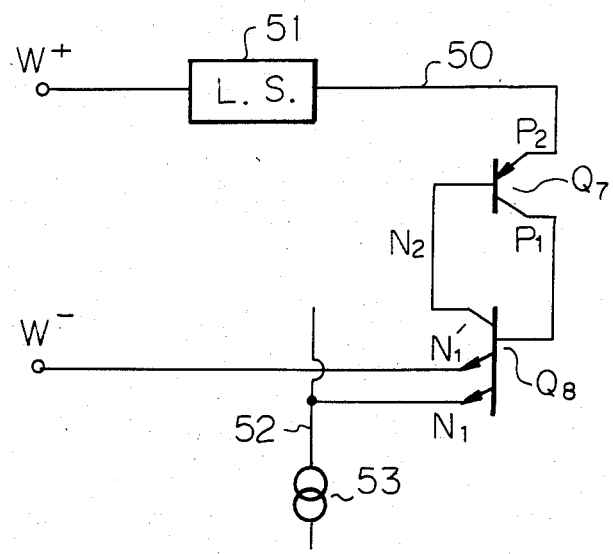
FIG. 5 is a circuit diagram of a word-line discharging circuit used in a semiconductor memory device as an embodiment according to the present invention.
Figure 6:
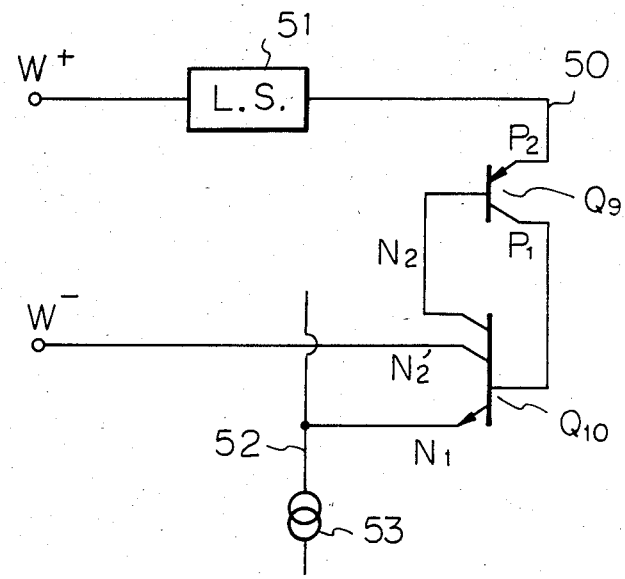
FIG. 6 is a circuit diagram of a word-line discharging circuit used in a semiconductor memory device as another embodiment according to the present invention.

FIGS. 5 and 6 are word-line discharging circuits, as embodiments of the present invention, used in semiconductor memory devices as embodiments. The circuits of FIGS. 5 and 6 each comprise an SCR whose anode terminal 50 is connected, by a voltage level shifter 51, to a word line $W^+$ having a high potential and whose cathode terminal 52, which corresponds to the $N_1$ portion, is connected to a constant-current source 53.

In the circuit of FIG. 5, the SCR comprises a PNP transistor $Q_7$ and an NPN transistor $Q_8$, which is formed as a multi-emitter transistor. A word line $W^-$ having a low potential is connected to the second emitter terminal $N_1'$ of the transistor $Q_8$ ($N_1P_1N_2$).

In the circuit of FIG. 6, the SCR comprises a PNP transistor $Q_9$ and an NPN transistor $Q_{10}$, which is formed as a multi-collector transistor. The word line $W^-$ having a low potential is connected to the second collector terminal $N_2'$ of the transistor $Q_{10}$ ($N_1P_1N_2$).

Figure 7:
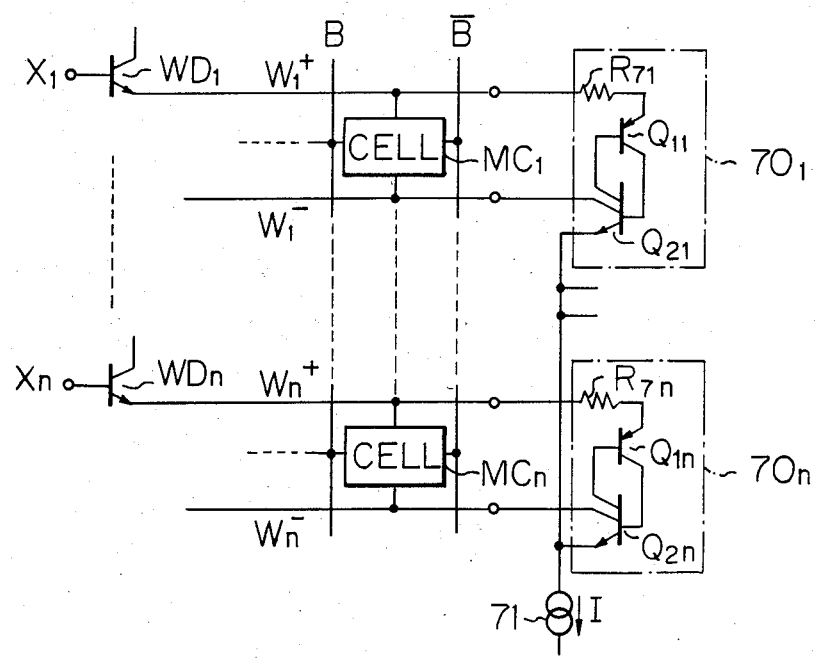
FIG. 7 is a circuit diagram of a semiconductor memory device using word-line discharging circuits identical to the one illustrated in FIG. 6.
Figure 8:
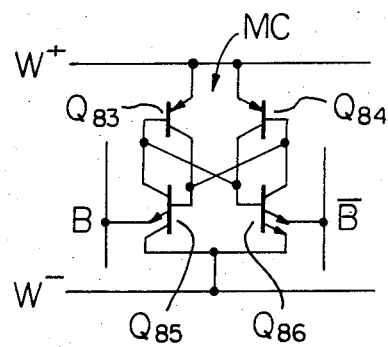
FIG. 8 is a circuit diagram of a memory cell used in the semiconductor memory device of FIG. 7.

FIG. 7 is a semiconductor memory device which is an embodiment of the present invention. In FIG. 7, $70_1$ through $70_n$ designate word-line discharging circuits, one circuit being arranged for each word line; $WD_1$ through $WD_n$ designate word line drivers; and $MC_1$ through $MC_n$ designate saturation-type memory cells. Each of the PNP-type transistors $Q_{11}$ through $Q_{1n}$ of the discharging circuits $70_1$ through $70_n$ corresponds to the transistor $Q_9$ of FIG. 5, and each of the NPN-type transistors $Q_{21}$ through $Q_{2n}$ thereof corresponds to the transistor $Q_{10}$ of FIG. 5. A constant-current source 71 is provided commonly for the discharging circuits $70_1$ through $70_n$, and the emitter electrodes of the transistors $Q_{21}$ through $Q_{2n}$ are commonly connected to the constant-current source 71 so as to form a current-switch circuit. The symbols $R_{71}$ through $R_{7n}$ designate resistors for level shifting or voltage dropping, each of which corresponds to the voltage level shifter of FIG. 5 and which are inserted between the word line $W_1^+$ through $W_n^+$ and the emitters of the transistors $Q_{11}$ through $Q_{1n}$. Each of the memory cells $MC_1$, $MC_2$,—has, for example, the structure shown in FIG. 8. In FIG. 8, $Q_{83}$ and $Q_{84}$ are PNP-type load transistors, $Q_{85}$ and $Q_{86}$ are NPN-type drive transistors each having multi-emitters, and B and $\overline{B}$ are a pair of bit lines.

In the circuit of FIG. 7, assume that a selecting signal $X_1$ is high (for example, $-0.9$ V) so that a word line $W_1^+$ is selected and that other selecting signals are low (for example $-1.9$ V), i.e., are in a non-selected state. In such a case, a current I of the constant-current source 71 flows only through the discharging circuit $70_1$, which is connected to the word line $W_1^+$ having a high potential. That is, since the potential of the word line $W_1^+$ is high, a current flows through the emitter-base path of the transistor $Q_{11}$. This current becomes the base current of the transistor $Q_{11}$ so that the collector current thereof flows. The collector current becomes the base current of the transistor $Q_{21}$, and the base current of the transistor $Q_{11}$ becomes the collector current of the transistor $Q_{21}$, thereby turning on the transistor $Q_{21}$. Therefore, the PNPN element, formed by the path from the emitter of the transistor $Q_{11}$ to the emitter of the transistor $Q_{21}$, is turned on. In this condition, the transistors $Q_{11}$ and $Q_{21}$ are both very saturated, with the result that the base potential of the transistor $Q_{21}$ becomes approximately equal to the emitter potential of the transistor $Q_{11}$. In the explanation, these potentials are assumed to be the same. Since the transistor $Q_{21}$ is a multi-collector transistor, a predetermined ratio, for example, 80%, of the currrent I flowing into the constant-current source 71 flows from the second collector connected to the word line $W_1^-$. For example, if $R=15$ kilohms, the current flowing from the emitter of the transistor $Q_{11}$ is 0.4 mA. In this case, each of the discharging circuits, connected to a non-selected row, for example, $70_n$, is also in a turned-on state. That is, since the discharging circuit $70_n$ is connected to a word line $W_n^+$ whose potential is low and since a discharging current does not flow through the discharging circuit 70, the potential of the emitter of the transistor $Q_{1n}$ is approximately equal to the potential of the word line $W_n^+$ (i.e., $-1.9$ V). The potential of the second collector of the transistor $Q_{2n}$ is equal to the potential of the word line $W_n^-$ ($-2.7$ V). Therefore, the second collector of the transistor $Q_{2n}$ operates as an emitter, and a PNPN element, formed by a path from the emitter of the transistor $Q_{1n}$ to the second collector of the transistor $Q_{2n}$, is turned on. However, a PNPN element, formed by a path from the emitter of the transistor $Q_{1n}$ to the emitter of the transistor $Q_{2n}$, is in a turned-off state.

Figure 1:
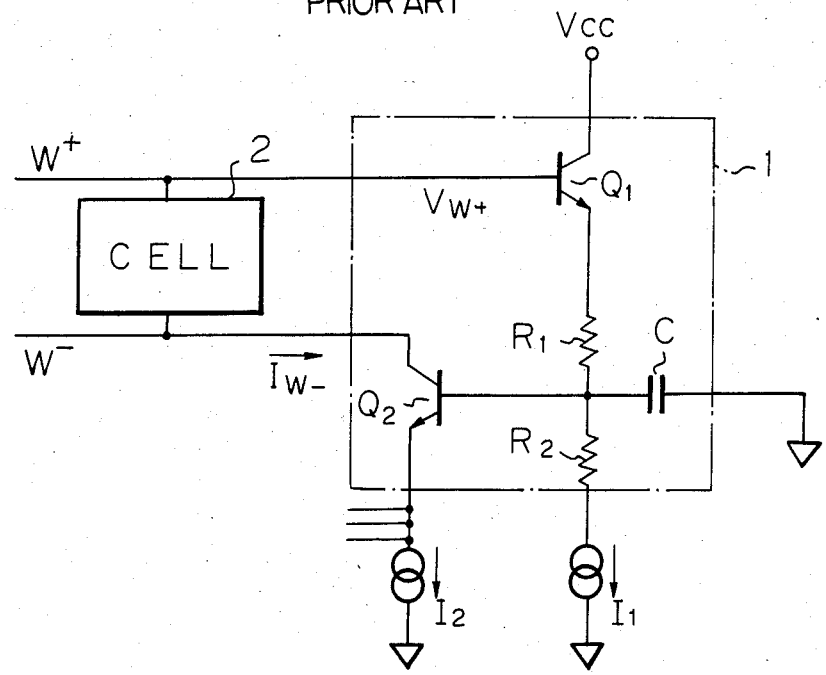
FIG. 1 is a circuit diagram of a word-line discharging circuit used in a conventional memory device.
Figure 2:
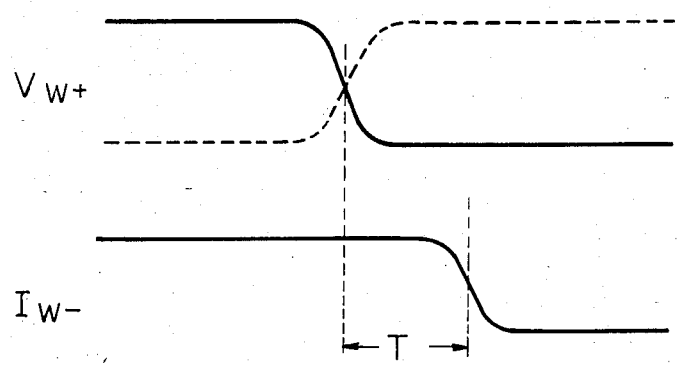
FIG. 2 is a waveform diagram of the operation of the word-line discharging circuit of FIG. 1.

Let us consider a case in which the potential of the base ($X_1$) of the word line driver $WD_1$ of the selected column $W_1^+$ changes from the potential of the selected state ($-0.1$ V) to the potential of the non-selected state ($-1.1$ V). In such a condition, since the transistors $Q_{11}$ and $Q_{21}$ are saturated and slowly respond to the changes in the base potentials, the discharging current I continues to flow through these transistors for a predetermined delay time even after the base potentials thereof have changed. Thus, as is illustrated in FIG. 2, a discharging operation is continuously effected even after the word line $W_1^+$ has changed to a non-selected state. Electric charges remaining in the word lines $W_1^+$ and $W_1^-$ and memory cell portions are coercively discharged, and the potential of the word lines $W_1^+$ and $W_1^-$ falls rapidly, thereby preventing double selection. The resistors $R_{71}$ through $R_{7n}$ of FIG. 7 serve to drop the potential level of a discharging circuit connected to a selected row. If the resistors $R_{71}$ through $R_{7n}$ are not used, the second collector of the transistor $Q_{21}$ is completely forward-biased and the discharging current flows mainly through the path including the word line $W_1^+$ and the transistor $Q_{11}$, with the result that the discharging current does not flow from the memory cells.

Figure 9:
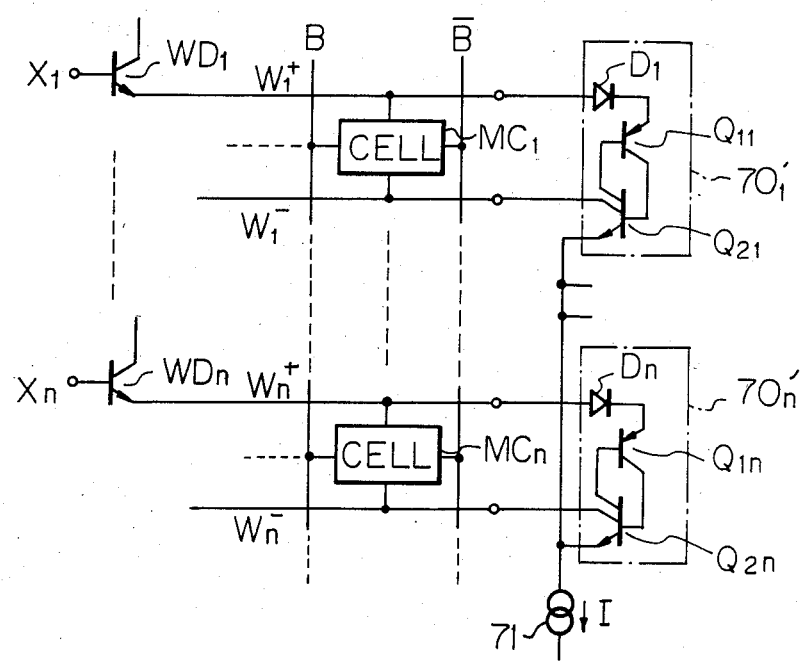
FIG. 9 is a circuit diagram of another semiconductor memory device using word-line discharging circuits identical to the one illustrated in FIG. 6.

FIG. 9 is an embodiment in which the resistors $R_{71}$ through $R_{7n}$ of the device of FIG. 7 are replaced with diodes $D_1$ through $D_n$ for level shifting. It should be noted that each of the PNPN elements of FIG. 9 is completely turned off in a non-selected state.

Figure 10:
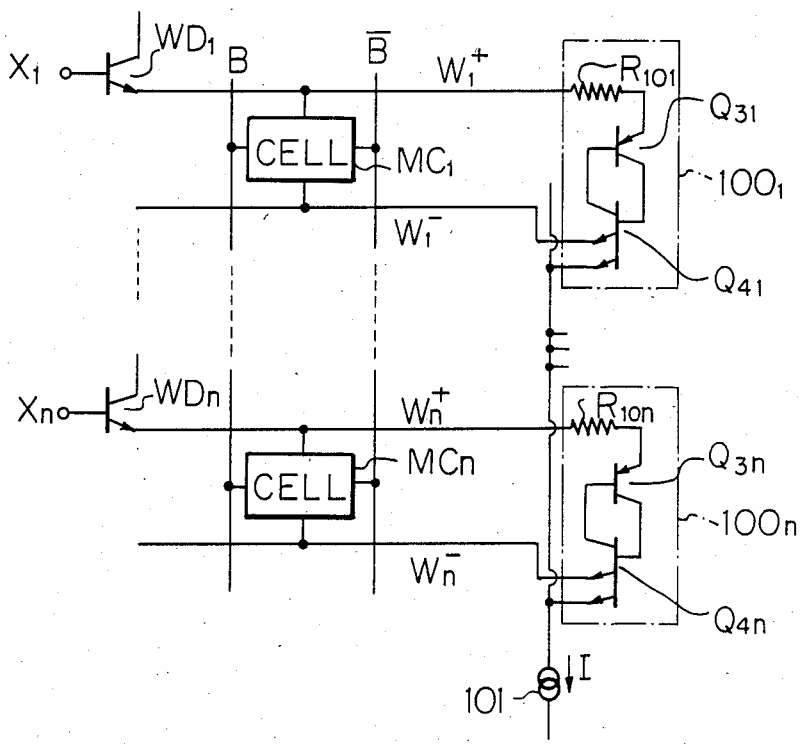
FIG. 10 is a circuit diagram of a semiconductor memory device using word-line discharging circuits identical to the one illustrated in FIG. 5.

FIG. 10 is a memory device of still another embodiment in which discharging circuits $100_1$ through $100_n$ use multi-emitter-type NPN transistors $Q_{41}$ through $Q_{4n}$ in a manner similar to the fundamental circuit of FIG. 5. In the device of FIG. 10, each of the second emitters connected to the word lines $W_1^-$ through $W_n^-$ operates as a collector. It is possible to control the quantity of a current flowing from a word line having a low potential to a constant-current source 101 by changing the current amplification factors of the two emitters. The principle of operation of the circuit of FIG. 10 is the same as that of FIG. 9. In any of the embodiments mentioned above, a constant-current source can be replaced with a constant-voltage source.

In the above-mentioned embodiments, it is not necessary to use capacitors having a large capacitance and resistors having a high resistance, resulting in decrease in the area occupied by discharging circuits. Since, in the embodiment of FIG. 10, PNPN elements, each having a multi-emitter transistor, are realized by the same structure of memory cells, it is easy to manufacture the memory device and it is possible to automatically change the time constant in accordance with the capacitance of the memory cells.

However, in the above-mentioned discharging circuits, since the ratio between the discharging current extracted from the word line W+ having a high potential and the discharging current extracted from the word line W− having a low potential is determined by the structure of the SCR, it is impossible to determine values of the magnitudes or the ratio of these discharging currents as any desired values, and it is rather difficult to design and manufacture the transistors of the SCR.

Figure 11:
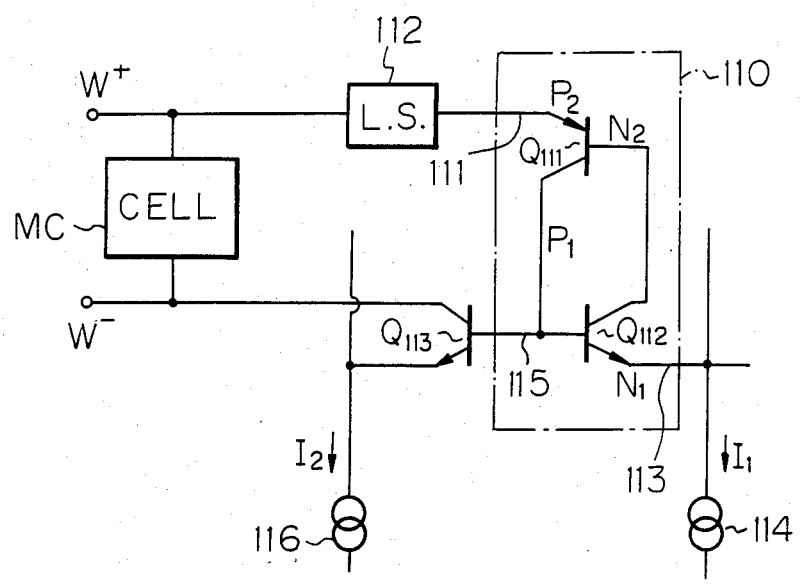
FIGS. 11 and 12 are circuit diagrams of word-line discharging circuits used in semiconductor memory devices as other embodiments according to the present invention.

FIG. 11 is part of a semiconductor memory device which is another embodiment of the present invention and which uses word-line discharging circuits which do not involve the above-mentioned problems. In the word-line discharging circuits of FIG. 11, the magnitudes of the current extracted from a word line having a high potential and the current extracted from a word line having a low potential can be adjusted, i.e., the current ratio can be controlled independent of the structure of the SCR by relying on the current values of two constant-current sources. In practice a plurality of bipolar static-type memory cells MC (only one is shown in FIG. 11) are connected between a word line W+ having a high potential and a word line W− having a low potential. At the farthest end of the word line W+, the anode terminal 111 of an SCR 110 which is PNPN element, is connected to the word line W+ via a voltage level shifter 112. The cathode terminal 113 of the SCR and the cathode terminals of the SCRs corresponding to the other word line(not shown) are commonly connected to a constant-current source 114.

In the embodiment shown in FIG. 11, an output terminal is attached to the $P_1$ portion 115 of the $P_2N_2P_1N_1$ element of the SCR and is connected to the base terminal of a discharging transistor $Q_{113}$. The collector of the transistor $Q_{113}$ is connected to a word line W− having a low potential, and the emitter of the transistor $Q_{113}$ and the emitters of the discharging transistors, each corresponding to the transistor $Q_{113}$, of the other word lines are commonly connected to another constant-current source 116. The SCR 110 has a fourlayer structure of $P_2N_2P_1N_1$, described before with reference to FIG. 3A. In a word-line discharging circuit using such a PNPN element, it is possible to obtain a delay in a discharging current extracted from the word line W− by utilizing an SCR since an SCR has a slow voltage response. That is, an SCR has a large capacitance comprising a junction capacitance and a diffusion capacitance, when a current flows therethrough. When a current flows through the SCR 110, the transistor $Q_{111}$ having a $P_2N_2P_1$ structure and the transistor $Q_{112}$ having an $N_2P_1N_1$ structure are both saturated, and each of the PN junctions of these transistors has not only a junction capacitance created by the depletion layer but also a diffusion capacitance which is proportional to the current flowing therethrough. When the SCR 110 is in a turned-on state, since the transistor $Q_{111}$ is saturated, the potential of the anode terminal 111 is higher than the potential of the base of the transistor $Q_{113}$ by about 0.4 V, i.e., by the potential between the collector $P_1$ and the emitter $P_2$, and the potential of the word line W+ is higher than the potential of the anode terminal 111 by the voltage level shift of the voltage level shifter 112. By using such potential distribution, it is possible to create an appropriate potential difference, for example, 0.8 V, between the word lines W+ and W−. When the word line W+, having a high potential, is selected by an address signal, the potential of the word line W+ becomes higher and a current $I_1$ flows from the anode terminal 111 to the cathode terminal 113 of the SCR 110. In such a condition, since the base current is supplied to the non-saturated transistor $Q_{113}$, the transistor $Q_{113}$ is turned on and a discharging current $I_2$ flows from the word line W−, having a low potential, through the collector-emitter path of the transistor $Q_{113}$. When the word line W+ changes from a selected state to a non-selected state, the potential thereof changes from high to low. In such a condition, since the SCR 110 operates as a capacitor having a large capacitance, the potential of the base terminal 115 of the transistor $Q_{113}$ does not immediately fall to a low potential level but instead is maintained to keep the transistor $Q_{113}$ in a turned-on state. That is, the discharging current continues to flow for a while from the word line W− through the collector-emitter path of the transistor $Q_{113}$. When the electric charges stored in the capacitor of the SCR 110, having a large capacitance, are discharged so that it becomes impossible to supply a sufficiently large current to the base of the transistor $Q_{113}$, the transistor $Q_{113}$ is turned off and the discharging current is cut off. That is, the transistor $Q_{113}$ is in a turned-on state and the discharging current flows for a while after the word line W+ has changed from a selected state to a non-selected state. When the word line W+, having a high potential, changes from a selected state to a non-selected state or vice versa, the discharging circuit effectively works to increase the write-in and the readout speed of the RAM device. It is necessary, in this case, to extract the discharging current from the word line W− not only at the time the potential of the word line W+ changes but also after it changes. It is necessary to use a delay circuit structure to continue to extract the discharging current for a predetermined delay time and to stop the flow of the discharging current after the predetermined delay time. The word-line discharging circuit according to the present invention uses an SCR in a delay circuit structure therein. In the word-line discharging circuit it is possible to control the current ratio between the word lines W+ and W−. According to the present invention, in the SCR discharging circuit of FIG. 11, which is different from the SCR discharging circuit of FIGS. 5 and 6, the current $I_1$ of the word line W+, which flows between the anode terminal 111 and the cathode terminal 113 of the SCR 110, is determined by the magnitude of the current of the constant-current source 114 ($I_1$). The discharging current of the word line W− is independently determined by the magnitude of the current of the constant-current source 116 ($I_2$) connected to the emitter of the transistor $Q_{113}$. The discharging circuit of FIG. 11 is improved in this respect than that of FIGS. 5 and 6. The SCR discharging circuit of FIGS. 5 and 6 has a disadvantage in that the magnitude of the discharging current is determined by the structure of the transistors of the SCR and varies depending on the parameters of the SCR. However, in the SCR discharging circuit of FIG. 11, the current ratio is accurately determined. Therefore, it is possible to determine the current of the word line W+ to be, for example, 0.5 mA and the current of the word line W− to be large, for example, 1.5 mA, thereby decreasing the number of erroneous operations when a write-in or readout operation is effected and making the operating speed uniform and independent of the position of a selected word line.

Figure 12:
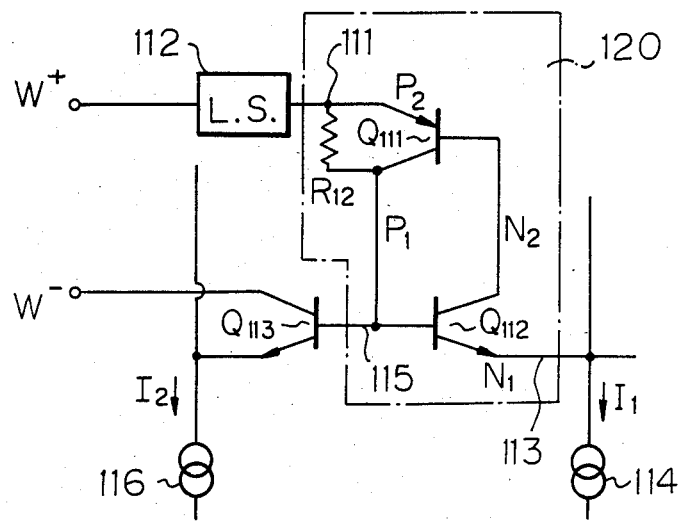

FIG. 12 is a word-line discharging circuit which uses a PNPN element and which is used in a semiconductor memory device as still another embodiment of the present invention. In the circuit of FIG. 12, a resistor $R_{12}$ is inserted between the emitter and the collector of the $P_2N_2P_1$ transistor $Q_{111}$ of the SCR 120. The resistor $R_{12}$ operates so as to prevent the $P_2N_2P_1$ transistor $Q_{111}$ from being turned off, thereby decreasing the delay time of the word-line discharging circuit. Therefore, it is possible to adjust the delay time of the word-line discharging circuit to an appropriate value by changing the resistance of the resistor $R_{12}$.

Figure 13:
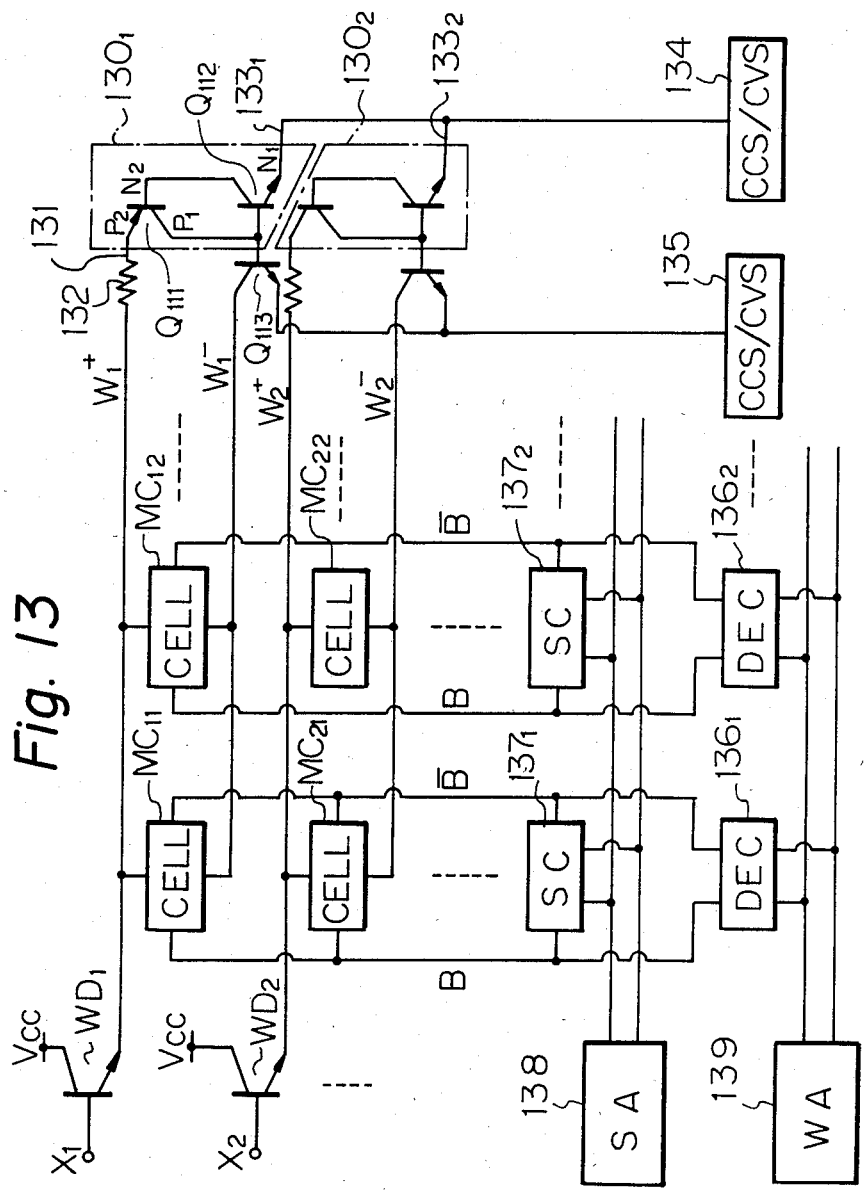
FIG. 13 is a block circuit diagram illustrating a semiconductor memory device as still another embodiment according to the present invention, the semiconductor memory device using the word-line discharging circuits illustrated in FIG. 11.

FIG. 13 is a circuit of a semiconductor memory device in which the word-line discharging circuits according to the present invention are connected to a memory cell array thereof.

In the circuit of FIG. 13, the base terminal of each of the word line drivers $WD_1$, $WD_2$,—is connected to the output terminal of an address decoder (not shown), collector terminals thereof are connected to the terminal of a power source $V_{CC}$ having a high potential, and the emitter terminals thereof are connected to corresponding word lines $W_1^+$, $W_2^+$,—having high potentials. Since a plurality of bipolar-type RAM cells, for example, $MC_{11}$, $MC_{12}$,—arranged in rows, are connected to each of the word lines $W_1^+$, $W_2^{30}$,—having a high potential, the load of each of the word lines $W_1^+$, $W_2^+$,—is large, and each of the word line drivers $WD_1$, $WD_2$,—is used as an emitter-follower circuit. The word line $W_1^+$ is connected to the anode terminal 131 of the SCR $130_1$ as a PNPN element in a word-line discharging circuit via a resistor 132 used as a voltage level shifter in the aforementioned manner. The cathode terminal $133_1$ of the SCR $130_1$, together with the cathode terminal $133_2$ of the SCR $130_2$ and other cathode terminals corresponding to other word lines, is commonly connected to a constant-current source 134.

The circuit of FIG. 13 uses the discharging circuit of FIG. 11, in which the base of the discharging transistor $Q_{113}$ is connected to the $P_1$ portion of the $P_2N_2P_1N_1$ element of the SCR. The word line $W^-$, having a low potential and being connected to the memory cells $MC_{11}$, $MC_{12}$,—in the first row, is connected to the collector terminal of the discharging transistor $Q_{113}$. The emitter of the transistor $Q_{113}$ is connected to another constant-current source 135, together with the emitters of the transistors each corresponding to the transistor $Q_{113}$, and to other word lines. The memory cells $MC_{11}$, $MC_{21}$,—disposed in the first column, the memory cells $MC_{12}$, $MC_{22}$,—disposed in the second column, and so on are commonly connected to corresponding pairs of bit lines B and $\bar{B}$ which are connected to bit address decoders $136_1$, $136_2$, and so on via sense circuits $137_1$, $137_2$, and so on. The bit address decoders $136_1$, $136_2$, and so on select one of the memory cells arranged in a row, the memory cells being selected by the word address decoder, and thereby the readout or write-in operation of a selected memory cell is controlled. In order to control the readout and write-in operation, a sense amplifier 138 is commonly connected to the sense circuits $137_1$, $137_2$,—, and a write-in amplifier 139 is commonly connected to the bit address decoders $136_1$, $136_2$,—.

In the above-mentioned embodiments, it should be noted that the constant-current source 134 connected to the cathode terminals $133_1$, $133_2$,—of the SCRs to independently determined the magnitude of the discharging currents from the word lines $W^+$ and $W^-$ and the constant-current source 135 connected to the emitters of the discharging transistors $Q_{113}$ and so on, can be replaced with constant-voltage sources.

As was mentioned above, since each of the word-line discharging circuits used in the semiconductor memory device according to the present invention uses an SCR as a PNPN element, it is possible to delay the time when the discharging current from the word line $W^-$ is cut off after the word line $W^+$ has changed from a selected state to a non-selected state by utilizing the slow voltage response of the SCR. It is also possible to decrease the area occupied by the word-line discharging circuits and to independently determine the magnitudes of the discharging current from the word line $W^+$ having a high potential and of the discharging current from the word line $W^-$ having a low potential. Therefore, according to the present invention, there is provided a bipolar-type RAM device which does not operate erroneously, which has a high reliability, and which has a high readout and write-in speed.

I claim:

1. A semiconductor memory device including pairs of word lines, and a first constant current source or a first constant voltage source, comprising:
    a plurality of static-type memory cells, respectively connected to the pairs of word lines, each of the pairs of word lines including a word line having a high potential and a word line having a low potential; and
    a plurality of word-line discharging circuits, each of said word line discharging circuits being connected to a respective one of the pairs of word lines, and comprising:
    a voltage level shifter operatively connected to the word lines having the high potential; and
    a thyristor having an anode operatively connected to said voltage level shifter and having a cathode operatively connected to the first constant-current source or the first constant-voltage source.

2. A semiconductor memory device according to claim 1, wherein said thyristor comprises:
    a PNP transistor having a collector, having a base and having an emitter operatively connected to said voltage level shifter; and
    a first NPN transistor having a collector and having a base, respectively, operatively connected to the base and the collector of said PNP transistor, and having an emitter operatively connected to the first constant-current source or the first constant-voltage source.

3. A semiconductor memory device according to claim 2, wherein said first NPN transistor is a multi-emitter transistor, one of the emitters of said multi-emitter transistor being connected to the word lines having the low potential and another emitter thereof being connected to the first constant-current source or the first constant-voltage source.

4. A semiconductor memory device according to claim 2, wherein said first NPN transistor is a multi-collector transistor, one of the collectors of said multi-collector transistor being connected to the base of said PNP transistor and another collector being connected to the word lines having the low potential.

5. A semiconductor memory device according to claim 2, further comprising a second constant current source or a second constant voltage source and wherein each of said word-line discharging circuits comprises a second NPN transistor having a base operatively connected to the base of said first NPN transistor, having a collector operatively connected to the word lines having the low potential, and having an emitter operatively connected to the second constant-current source or the second constant-voltage source.

6. A semiconductor memory device according to claim 5, wherein the second constant-current source or the second constant-voltage source is provided commonly for all of the word-line discharging circuits.

7. A semiconductor memory device according to claim 5, wherein said word-line discharging circuit comprises a resistor operatively connected between the emitter and the collector of said PNP transistor.

8. A semiconductor memory device according to claim 2, wherein said word-line discharging circuit comprises a resistor operatively connected between the emitter and the collector of said PNP transistor.

9. A semiconductor memory device according to claim 1, wherein the constant-current source or constant-voltage source is provided commonly for all of the word-line discharging circuits.

10. A semiconductor memory device according to claim 1, wherein said voltage level shifter comprises a diode inserted between the word lines having the high potential and the anode of said thyristor.

11. A semiconductor memory device according to claim 1, wherein said voltage level shifter comprises a resistor inserted between the word lines having the high potential and the anode of said thyristor.

12. A word line discharging circuit operatively connected to a pair of word lines, one of the pair of word lines having a high potential and the other of the pair of word lines having a low potential, and operatively connectable to a first constant current source, comprising:
  a voltage level shifter operatively connected to the word line having the high potential;
  a PNP transistor having an emitter operatively connected to said voltage level shifter, having a base and having a collector; and
  a first NPN transistor having a base operatively connected to the collector of said PNP transistor, having a collector operatively connected to the base of said PNP transistor and having multi-emitters, one of the multi-emitters operatively connected to the first constant current source and another one of the multi-emitters operatively connected to the word line having the low potential.

13. A word line discharging circuit according to claim 12, further comprising:
  a second NPN transistor having a base operatively connected to the base of said first NPN transistor, having a collector operatively connected to the word line having the low potential and having an emitter; and
  a second constant current source operatively connected to the emitter of said second NPN transistor.

14. A word line discharging circuit according to claim 13, further comprising a resistor operatively connected between the emitter and the collector of said PNP transistor.

15. A word line discharging circuit operatively connected to a pair of word lines, one of the pair of word lines having a high potential and the other one of the pair of word lines having a low potential, and operatively connectable to a first constant current source, comprising:
  a voltage level shifter operatively connected to the word line having the high potential;
  a PNP transistor having an emitter operatively connected to said voltage level shifter, having a base and having a collector; and
  a first NPN transistor having a base operatively connected to the collector of said PNP transistor, having an emitter operatively connected to the first constant current source, and having multi-collectors, one of the multi-collectors operatively connected to the word line having the low potential and another one of the multi-collectors operatively connected to the base of said PNP transistor.

* * * * *

UNITED STATES PATENT AND TRADEMARK OFFICE
CERTIFICATE OF CORRECTION

PATENT NO. : 4,604,728

DATED : AUGUST 5, 1986

INVENTOR(S) : YOSHINORI OKAJIMA

It is certified that error appears in the above-identified patent and that said Letters Patent is hereby corrected as shown below:

Col. 9, line 28, "$W_2^{30}$" should be --$W_2^+$--.

Signed and Sealed this

Twenty-eighth Day of October, 1986

[SEAL]

*Attest:*

DONALD J. QUIGG

*Attesting Officer*      *Commissioner of Patents and Trademarks*